(12) United States Patent
Rowden et al.

(10) Patent No.: US 9,972,569 B2
(45) Date of Patent: May 15, 2018

(54) ROBUST LOW INDUCTANCE POWER MODULE PACKAGE

(71) Applicant: General Electric Company, Schenectady, NY (US)

(72) Inventors: Brian Lynn Rowden, Ballston Lake, NY (US); Ljubisa Dragoljub Stevanovic, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days. days.

(21) Appl. No.: 15/482,228

(22) Filed: Apr. 7, 2017

(65) Prior Publication Data

US 2017/0294373 A1 Oct. 12, 2017

Related U.S. Application Data

(60) Provisional application No. 62/321,421, filed on Apr. 12, 2016.

(51) Int. Cl.
| | | |
|---|---|---|
| *H01L 23/00* | (2006.01) | |
| *H01L 23/14* | (2006.01) | |
| *H01L 23/49* | (2006.01) | |
| *H01L 23/492* | (2006.01) | |
| *H01L 23/495* | (2006.01) | |
| *H01L 23/50* | (2006.01) | |
| *H01L 25/00* | (2006.01) | |
| *H01L 25/18* | (2006.01) | |
| *H01L 25/07* | (2006.01) | |

(52) U.S. Cl.
CPC ............ *H01L 23/50* (2013.01); *H01L 23/142* (2013.01); *H01L 23/49* (2013.01); *H01L 23/492* (2013.01);

(Continued)

(58) Field of Classification Search
CPC . H01L 2224/48237; H01L 2224/48257; H01L 23/495; H01L 23/492;

(Continued)

(56) References Cited

U.S. PATENT DOCUMENTS 5,172,310 A 12/1992 Deam et al.
6,845,017 B2 1/2005 Ahmed et al.
(Continued)

OTHER PUBLICATIONS

G L Skibinski et al., "Design methodology and modeling of low inductance planar bus structures", Power Electronics and Applications, 1993., Fifth European Conference on, vol. 3, pp. 98-105, Sep. 13-16, 1993, Brighton.

(Continued)

*Primary Examiner* — Jasmine Clark
(74) *Attorney, Agent, or Firm* — Nitin N. Joshi

(57) ABSTRACT

A method and system for a power module is provided. The power module includes a first substrate including a first conductive substrate having a first plurality of power semiconductor switches arranged thereon, and at least one second conductive substrate electrically coupled to the first conductive substrate. A first terminal is electrically coupled to the first conductive substrate. The power module also includes a second substrate including a third conductive substrate having a second plurality of power semiconductor switches arranged thereon, and at least one fourth conductive substrate electrically coupled to the third conductive substrate. The third conductive substrate is electrically coupled to the second conductive substrate. A second terminal is electrically coupled to the fourth conductive substrate.

20 Claims, 13 Drawing Sheets

(52) U.S. Cl.
CPC .... *H01L 23/4952* (2013.01); *H01L 23/49537* (2013.01); *H01L 23/49575* (2013.01); *H01L 24/48* (2013.01); *H01L 24/49* (2013.01); *H01L 25/072* (2013.01); *H01L 25/18* (2013.01); *H01L 25/50* (2013.01); *H01L 2224/48245* (2013.01)

(58) Field of Classification Search
CPC .............. H01L 23/49537; H01L 25/50; H01L 2924/00014; H01L 25/18; H01L 23/49562; H01L 23/142; H01L 24/48; H01L 23/49575; H01L 23/4952; H01L 2224/48245; H01L 23/50; H01L 23/49; H01L 2924/00; H01L 2224/48091
See application file for complete search history.

(56) References Cited

U.S. PATENT DOCUMENTS

| | | |
|---|---|---|
| 7,798,833 B2 | 9/2010 | Holbrook |
| 7,916,480 B2 | 3/2011 | Woody et al. |
| 8,193,449 B2 | 6/2012 | Esmaili et al. |
| 8,279,620 B2 | 10/2012 | Herron et al. |
| 8,480,419 B2 | 7/2013 | Holbrook et al. |
| 2005/0024805 A1* | 2/2005 | Heilbronner ............ H01L 24/49 361/100 |
| 2011/0051371 A1 | 3/2011 | Azuma et al. |
| 2011/0310568 A1* | 12/2011 | Hong ..................... G01R 1/203 361/737 |

OTHER PUBLICATIONS

H J Beukes et al., "Busbar design considerations for high power IGBT converters", Power Electronics Specialists Conference, 1997. PESC '97 Record., 28th Annual IEEE, vol. 2, pp. 847-853, Jun. 22-27, 1997, St. Louis, MO.

M C Caponet et al., "Low stray inductance bus bar design and construction for good EMC performance in power electronic circuits", IEEE Transactions on Power Electronics, vol. 17, Issue: 2, pp. 225-231, Mar. 2002.

International Search Report and Written Opinion issued in connection with corresponding PCT Application No. PCT/US2017/027137 dated Jul. 13, 2017.

* cited by examiner

ROBUST LOW INDUCTANCE POWER MODULE PACKAGE

BACKGROUND

The field of the disclosure relates generally to power switching module assemblies and, more particularly, to power switching module assembly structures that provide low circuit inductance.

The field of the disclosure relates generally to power switching module assemblies and, more particularly, to power switching module assembly structures that provide low circuit inductance.

At least some known semiconductor power module packages route signals either through a power substrate or through metal traces in a wall geometry. For the power substrate, the signal paths are typically direct bond or active metal brazed copper or aluminum on a ceramic substrate which are single layer and require that the traces be adjacent to one another on a planar surface. The semiconductor devices are then wire, ribbon, or planar interconnect bonded to the planar metal traces which run across the module and are wire, ribbon, or planar interconnect bonded to the output terminals.

To improve the efficiency and the reliability of power semiconductor devices, the surrounding packaging connecting the power devices to the power system must introduce minimal parasitic inductance, which may contribute to power system losses or may have a detrimental impact on the capability of the device either electrically, thermally, or mechanically. For power modules, the interconnects from devices are typically implemented with wire, ribbon, or planar interconnect bonding to copper traces routed on insulating substrates called direct bond copper (DBC). For power modules, the main or commutation power loop is the path of primary concern with current flowing between the positive and negative DC terminals.

BRIEF DESCRIPTION

In one embodiment, a power module is provided. The power module includes a first substrate including a first conductive substrate having a first plurality of power semiconductor switches arranged thereon, and at least one second conductive substrate electrically coupled to the first conductive substrate. A first terminal is electrically coupled to the first conductive substrate. The power module also includes a second substrate including a third conductive substrate having a second plurality of power semiconductor switches arranged thereon, and at least one fourth conductive substrate electrically coupled to the third conductive substrate. The third conductive substrate is electrically coupled to the second conductive substrate. A second terminal is electrically coupled to the fourth conductive substrate.

In another embodiment, a method of forming a power module is provided. The method includes providing a first conductive substrate on a first substrate, arranging a first plurality of power semiconductor switches on the first conductive substrate, and electrically coupling the first conductive substrate to a first terminal and to at least one second conductive substrate. The method also includes providing a third conductive substrate on a second substrate, arranging a second plurality of power semiconductor switches on the third conductive substrate, and electrically coupling the third conductive substrate to the second conductive substrate and to at least one fourth conductive substrate. The method further includes electrically coupling the fourth conductive substrate to a second terminal.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 1:
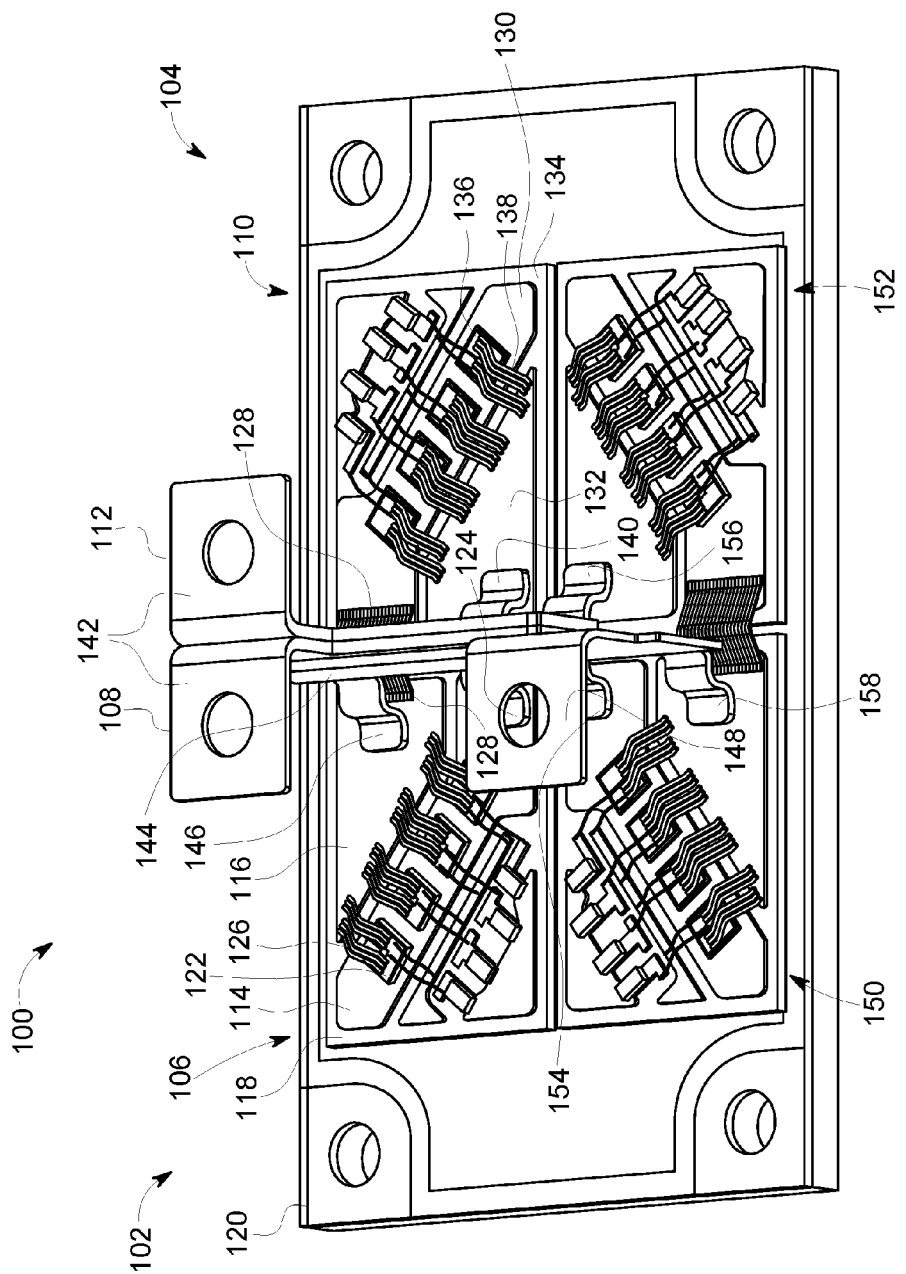
FIG. 1 is a perspective view of an exemplary power module.
Figure 2:
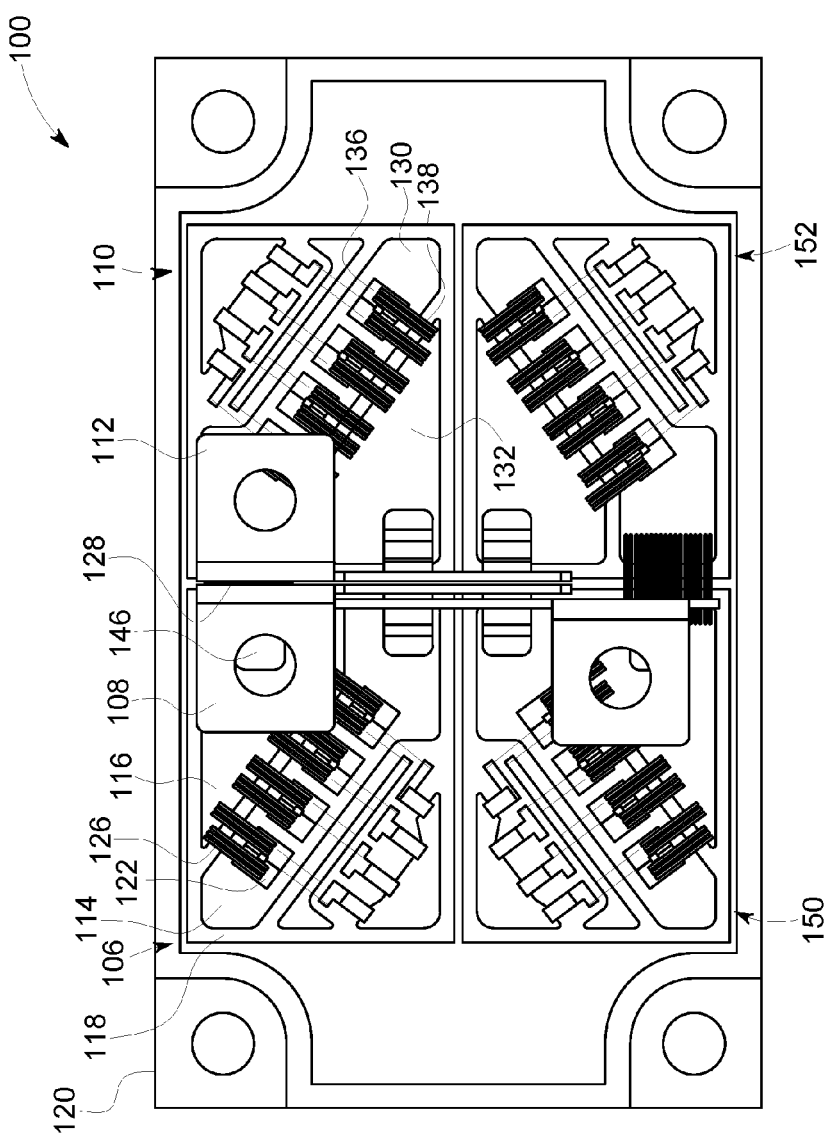
FIG. 2 is a top view of the power module shown in FIG. 1.
Figure 3:
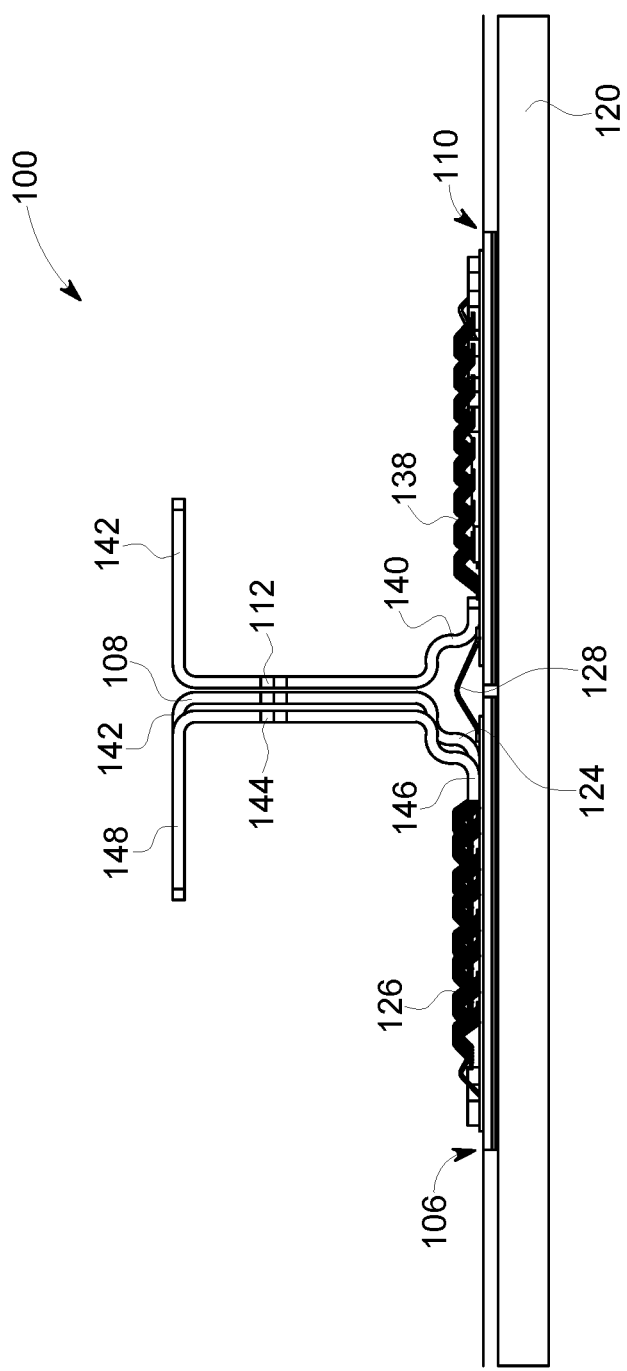
FIG. 3 is a side view of the power module shown in FIGS. 1 and 2.

FIG. 1 is a perspective view of an exemplary power module 100. FIG. 2 is a top view of power module 100. FIG. 3 is a side view of power module 100. In the exemplary embodiment, power module 100 includes a first side 102 and a second side 104. First side 102 includes a first substrate 106 electrically coupled to a first terminal 108. Second side 104 includes a second substrate 110 electrically coupled to a second terminal 112.

First substrate 106 includes a first conductive substrate 114 and a second conductive substrate 116. First and second conductive substrates 114, 116 are patterned copper layers that are disposed on a dielectric layer 118. Dielectric layer 118 may be made of ceramic material, such as alumina (Al2O3), aluminum nitride (AlN), silicon nitride (Si3N4) and like. First substrate 106, including first and second conductive substrates 114, 116 coupled to dielectric layer 118 forms a power electronic substrate, such as a direct bonded copper (DBC) substrate. First substrate 106 is disposed on a substantially planar baseplate 120.

First conductive substrate 114 includes a first plurality of power semiconductor switches 122 arranged thereon. For example, in the exemplary embodiment, the first plurality of power semiconductor switches 122 includes metal-oxide semiconductor field-effect transistors (MOSFET). Alternatively, the first plurality of power semiconductor switches 122 may include insulated gate bipolar transistors (IGBT), junction gate field-effect transistors (JFET), bipolar junction transistors (BJT). In addition to the aforementioned power switches, the substrate may also include anti-parallel rectifier diodes, such as PiN diode, Schottky Barrier Diode (SBD), or Junction Barrier Schottky (JBS) diode. The first plurality of power semiconductor switches 122 may be formed of semiconducting material, such as, for example, silicon, silicon carbide (SiC), Aluminum nitride (AlN), Gallium nitride (GaN), or Boron nitride (BN). In the exemplary embodiment, first conductive substrate 114 includes four power semiconductor switches 122 arranged thereon; however, first conductive substrate 114 may include any number of power semiconductor switches that enables power module 100 to function as described herein.

Each of the first plurality of power semiconductor switches 122 includes a drain terminal electrically coupled to first terminal 108 via first conductive substrate 114. That is, each of the first plurality of power semiconductor switches 122 has the drain connection on a bottom side of the switch. First terminal 108 is either soldered or ultrasonically welded to first conductive substrate 114 to form the electrical connection therebetween. First terminal 108 includes a first foot 124 extending therefrom that electrically couples it to first conductive substrate 114.

Each of the first plurality of power semiconductor switches 122 also includes a source terminal electrically coupled to second conductive substrate 116 using a first wire bond 126. That is, each of the first plurality of power semiconductor switches 122 has the source connection on a top side of the switch. First wire bond 126 is coupled to the top side of the switch to couple the source terminal to second conductive substrate 116. Thus, first conductive substrate 114 is electrically coupled to second conductive substrate 116 via the first plurality of power semiconductor switches 122 and first wire bonds 126.

Second conductive substrate 116 is electrically coupled to first wire bonds 126 to form the electrical connection with first conductive substrate 114. Second conductive substrate 116 is also electrically coupled to a second wire bond 128 to form an electrical connection with second side 104 of power module 100.

Current flowing from first terminal 108 flows through first foot 124 into first conductive substrate 114, through the drain terminal of each of the first plurality of power semiconductor switches 122, then through the source terminal of each of the first plurality of power semiconductor switches 122, through first wire bonds 126, and into second conductive substrate 116.

Second substrate 110 includes a third conductive substrate 130 and a fourth conductive substrate 132. Third and fourth conductive substrates 130, 132 are patterned copper layers that are disposed on a dielectric layer 134. Dielectric layer 134 may be made of ceramic material, such as alumina (Al2O3), aluminum nitride (AlN), silicon nitride (Si3N4) and like. Second substrate 110, including third and fourth conductive substrates 130, 132 coupled to dielectric layer 134 forms a power electronic substrate, such as a direct bonded copper (DBC) substrate. Second substrate 110 is disposed on substantially planar baseplate 120.

Third conductive substrate 130 includes a second plurality of power semiconductor switches 136 arranged thereon. For example, in the exemplary embodiment, the second plurality of power semiconductor switches 136 includes metal-oxide semiconductor field-effect transistors (MOSFET). Alternatively, the second plurality of power semiconductor switches 136 may include insulated gate bipolar transistors (IGBT), junction gate field-effect transistors (JFET), or bipolar junction transistors (BJT). In addition to the aforementioned power switches, the substrate may also include anti-parallel rectifier diodes, such as PiN diode, Schottky Barrier Diode (SBD), or Junction Barrier Schottky (JBS) diode. The second plurality of power semiconductor switches 136 may be formed of semiconducting material, such as, for example, silicon carbide (SiC), Aluminum nitride (AlN), Gallium nitride (GaN), or Boron nitride (BN). In the exemplary embodiment, third conductive substrate 130 includes four power semiconductor switches 136 arranged thereon; however, third conductive substrate 130 may include any number of power semiconductor switches that enables power module 100 to function as described herein.

Each of the second plurality of power semiconductor switches 136 includes a drain terminal electrically coupled to second conductive substrate 116 via third conductive substrate 130. That is, each of the second plurality of power semiconductor switches 136 has the drain connection on a bottom side of the switch. The electrical connection of the drain terminal to third conductive substrate 130 enables each of the second plurality of power semiconductor switches 136 to receive current flowing from second conductive substrate 116 to third conductive substrate 130 via second wire bond 128.

Each of the second plurality of power semiconductor switches 136 also includes a source terminal electrically coupled to fourth conductive substrate 132 using a third wire bond 138. That is, each of the second plurality of power semiconductor switches 136 has the source connection on a top side of the switch. Third wire bond 138 is coupled to the top side of the switch to couple the source terminal to fourth conductive substrate 132. Thus, fourth conductive substrate 132 is electrically coupled to third conductive substrate 130 via the second plurality of power semiconductor switches 136 and third wire bonds 138.

Fourth conductive substrate 132 is electrically coupled to third conductive substrate 130 as well as to second terminal 112. Second terminal 112 is either soldered or ultrasonically welded to fourth conductive substrate 132 to form the electrical connection therebetween. Second terminal 112 includes a first foot 140 extending therefrom that electrically couples it to fourth conductive substrate 132.

Current flowing from second conductive substrate 116 flows through second wire bond 128 into third conductive substrate 130, through the drain terminal of each of the second plurality of power semiconductor switches 136, then through the source terminal of each of the second plurality of power semiconductor switches 136, through third wire bonds 138 into fourth conductive substrate 132, and into second terminal via first foot 140.

In the exemplary embodiment, first terminal 108 is a positive DC terminal and second terminal 112 is a negative DC terminal. First terminal 108 and second terminal 112 are configured to be coupled to positive and negative external DC busbars (not shown), respectively. The "positive" and "negative" DC terminals and/or external DC busbars are at different electric potentials relative to one another during operation, but are not restricted to a specific polarity. In the exemplary embodiment, first terminal 108 and second terminal 112 substantially oppose one another, such that the terminals are in relatively close proximity over substantially the entirety of the terminals. For example, first terminal 108 and second terminal 112 are positioned between first side 102 and second side 104 and, more specifically, between first substrate 106 and second substrate 110. Further, first terminal 108 and second terminal 112 are adjacent to one another extending along a width of power module 100. In some embodiments, first terminal 108 and second terminal 112 extend substantially perpendicularly away from baseplate 120, first substrate 106, and second substrate 110. First terminal 108 and second terminal 112 may also include respective flanges 142 that provide an area for attaching the external DC busbars thereto.

Power module 100 further includes an output terminal 144 configured to be coupled to and provide power to an electrical load (not shown). In the exemplary embodiment, output terminal 144 is an AC output terminal. Output terminal 144 is disposed in relatively close proximity to first terminal 108 and second terminal 112. For example, output terminal 144 is positioned adjacent to first terminal 108 on first side 102 of power module 100 such that first terminal 108 is between output terminal 144 and second terminal 112. Output terminal 144 is electrically coupled to second conductive substrate 116. More specifically, output terminal 144 is either soldered or ultrasonically welded to second conductive substrate 116. Additionally, output terminal 144 may be positioned adjacent to either DC bus (i.e., either first terminal 108 or second terminal 112), or may be positioned between DC buses (i.e., sandwitched between first terminal 108 and second terminal 112). Such positioning enables tailoring an AC to DC coupling and symmetrical path lengths. Output terminal 144 includes a first foot 146 electrically coupled to second conductive substrate 116. Output terminal 144 includes a flange 148 to which an electrical load may be physically bolted.

In the exemplary embodiment, power module 100 may further include a third substrate 150 and a fourth substrate 152. Third substrate 150 is positioned on first side 102 of power module 100 adjacent to first substrate 106 along a width of power module 100. Fourth substrate 152 is positioned on second side 104 of power module 100 adjacent to second substrate 110 along the width of power module 100.

Third substrate 150 includes identical components and functionalities as first substrate 106, and fourth substrate 152 includes identical components and functionalities as second substrate 110, so their descriptions are not described in detail herein. Additionally, first terminal 108 includes a second foot 154 coupled to third substrate 150, second terminal 112 includes a second foot 156 coupled to fourth substrate 152, and output terminal 144 includes a second foot 158 coupled to third substrate 150, such that each terminal features a second foot with two substrates per switch structure.

The interconnection of first terminal 108, first substrate 106 and third substrate 150, second substrate 110 and fourth substrate 152, and second terminal 112 forms a commutation power loop path configured to minimize loop inductance within power module 100. More specifically, the interconnection of first terminal 108, first conductive substrate 114, the first plurality of power semiconductor switches 122, second conductive substrate 116, third conductive substrate 130, the second plurality of power semiconductor switches 136, and fourth conductive substrate 132, second terminal 112, and output terminal 144 forms the commutation power loop path. The commutation power loop path includes a source current path defined from first terminal 108 through first substrate 106 and third substrate 150, and a return current path defined from second substrate 110 and fourth substrate 152 through second terminal 112.

The first plurality of power semiconductor switches 122 in first substrate 106 and third substrate 150 form a first switch structure, and the second plurality of power semiconductor switches 136 in second substrate 110 and fourth substrate 152 form a second switch structure. In operation, first terminal 108, second terminal 112, and output terminal 144 are configured to be connected, respectively, to a positive DC busbar, a negative DC busbar, and an electrical load requiring a different voltage than that provided by the busbars. The first and second pluralities of power semiconductor switches 122, 136 are configured to be switched between a conductive and a non-conductive state ("regulated"). By controlling a rate of regulation of the first and second pluralities of power semiconductor switches 122, 136, a proper output voltage for supplying the load can be provided at output terminal 144.

In a conducting state of the first and second switch structures (i.e., in a conducting state of the first and second pluralities of power semiconductor switches 122, 136), current in power module 100 flows sequentially (from an external DC busbar electrically contacted with first terminal 108) to first terminal 108, to first conductive substrate 114 of first substrate 106 and third substrate 150 (via first foot 124 and second foot 154 of first terminal 108), then to the drains of the first plurality of power semiconductor switches 122 of the first switch structure, and then to second conductive substrate 116 of first substrate 106 and third substrate 150 via first wire bonds 126. The current then flows through second wire bonds 128 to third conductive substrate 130 of second substrate 110 and fourth substrate 152, into the drains of the second plurality of power semiconductor switches 136 of the second switch structure, to fourth conductive substrate 132 via third wire bonds 138. Next, the current flows through first foot 140 and second foot 156 into second terminal 112 (and ultimately on to another external DC busbar that electrically contacted with second terminal 112).

During operation, it is desirable to have the current flowing through individual current loops formed through each of the first pluralities of power semiconductor switches 122 of first substrate 106 and third substrate 150 and each of the second pluralities of power semiconductor switches 136 of second substrate 110 and fourth substrate 152 to be approximately evenly distributed. Such balance between the first and second pluralities of power semiconductor switches 122, 136 is accomplished when an impedance through the first and second pluralities of power semiconductor switches 122, 136 is approximately equal with respect to each other of the first and second pluralities of power semiconductor switches 122, 136. In the exemplary embodiment, bond wires are only formed between conductive substrates, and first terminal 108 and second terminal 112 are ultrasonically welded, soldered, brazed, or sintered to the conductive substrates to eliminate bond wire connections. Further the conductive substrates, first terminal 108, and second terminal 112 are positioned in close physical proximity and aligned with current flowing in adjacent conductors being oppositely directed. In this manner, an electromagnetic field generated in each conductor due to the current flow will tend to cancel electromagnetic field generated in adjacent conductors having opposite current flow. Cancellation of the electromagnetic fields reduces the inductance in those conductors thereby reducing the impedance of each individual current loop. Reducing the inductance in power switching circuit 400 also improves the performance of power switching circuit 400 at very high frequency operation.

In the exemplary embodiment, power module 100 is configured to reduce the parasitic inductance for the commutation power loop path from individual power semiconductor switches devices 122. To reduce the inductance, the current paths in and out of the module are maintained in close proximity with respect to each other so that an induced flux generated in each path when current flows through the modules are equal and opposite thus canceling each other out and reducing the overall parasitic inductance seen by the commutation power loop. To avoid spacing and separation requirements, a laminated bus structure bond wires are only formed between conductive substrates, and first terminal 108 and second terminal 112 are ultrasonically welded, soldered, brazed, or sintered to the conductive substrates to eliminate bond wire connections. Further the conductive substrates, first terminal 108, and second terminal 112 are positioned in close physical proximity and aligned with current flowing in adjacent conductors being oppositely directed. The laminated bus structure also allows for relatively short and very consistent wire bond lengths between power semiconductor switches to further reduce the inductance and resistance of the interconnect to power module 100.

Power module 100 provides 30%-70% lower inductance than is traditionally available in this type of design. Each of the individual substrates 106, 110, 150, 152 is individually testable before implementation into a system. The goal is to minimize parasitic inductance, which is accomplished by providing a very short commutation loop between first terminal 108 and second terminal 112. In addition, power module 100 provides reduced parasitic inductance between first terminal 108 and output terminal 144, as well as second terminal 112 and output terminal 144.

Figure 4:
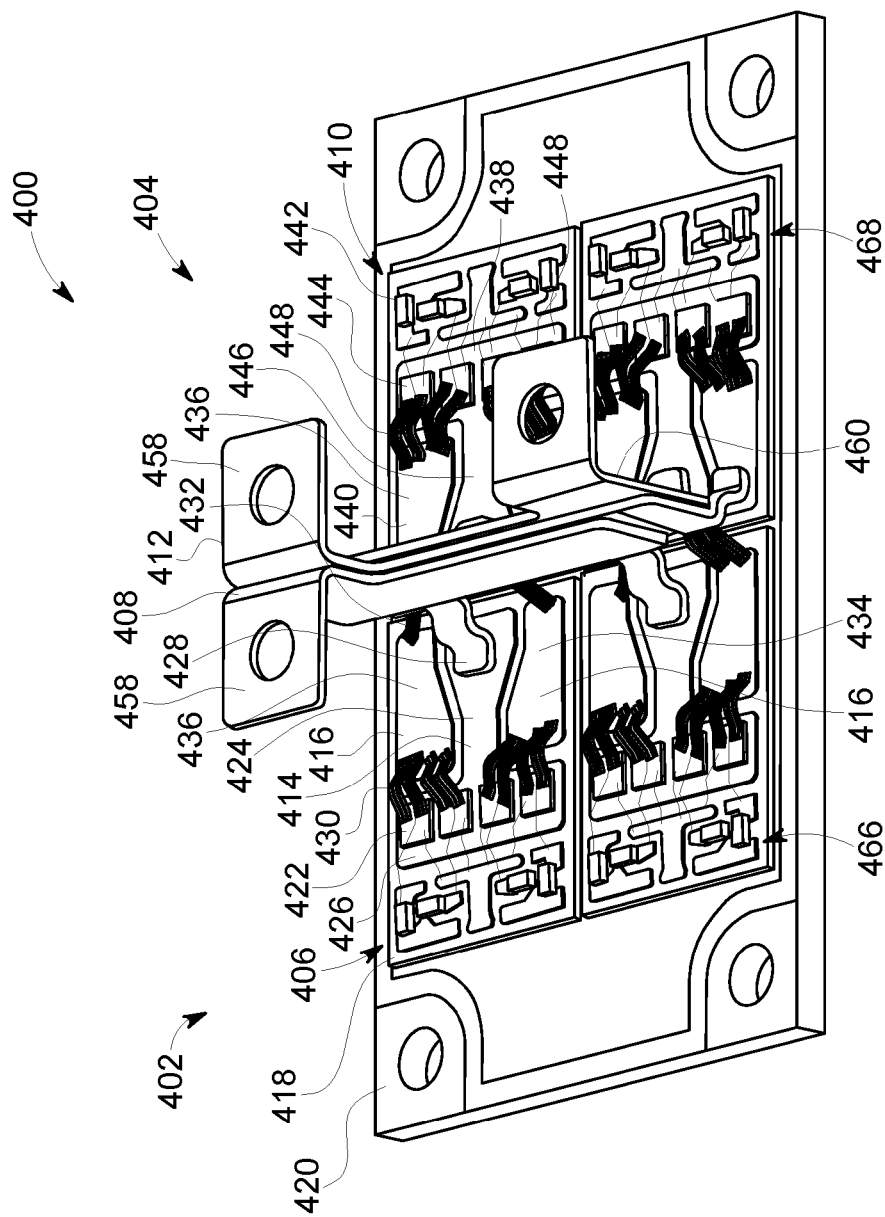
FIG. 4 is a perspective view of an exemplary power module.
Figure 5:
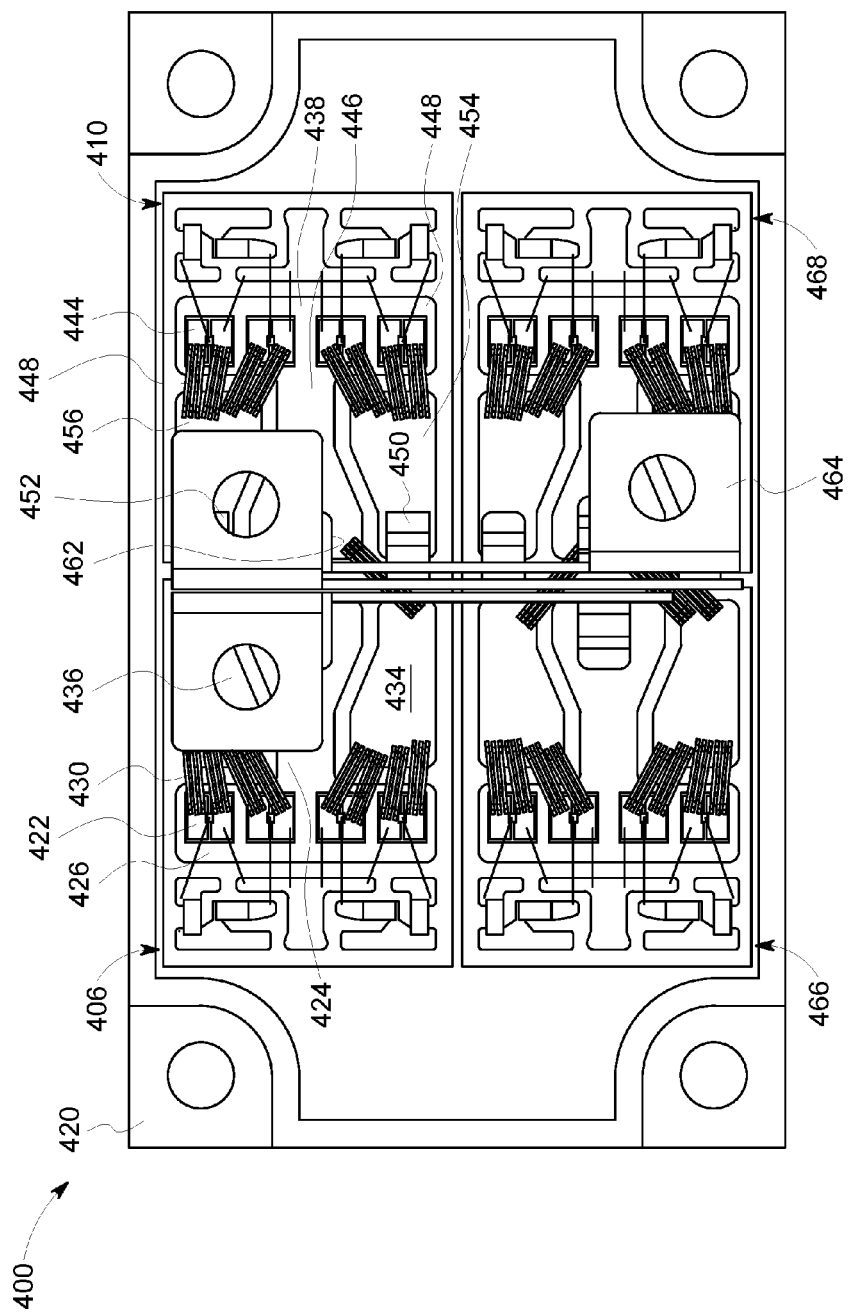
FIG. 5 is a top view of the power module shown in FIG. 4.
Figure 6:
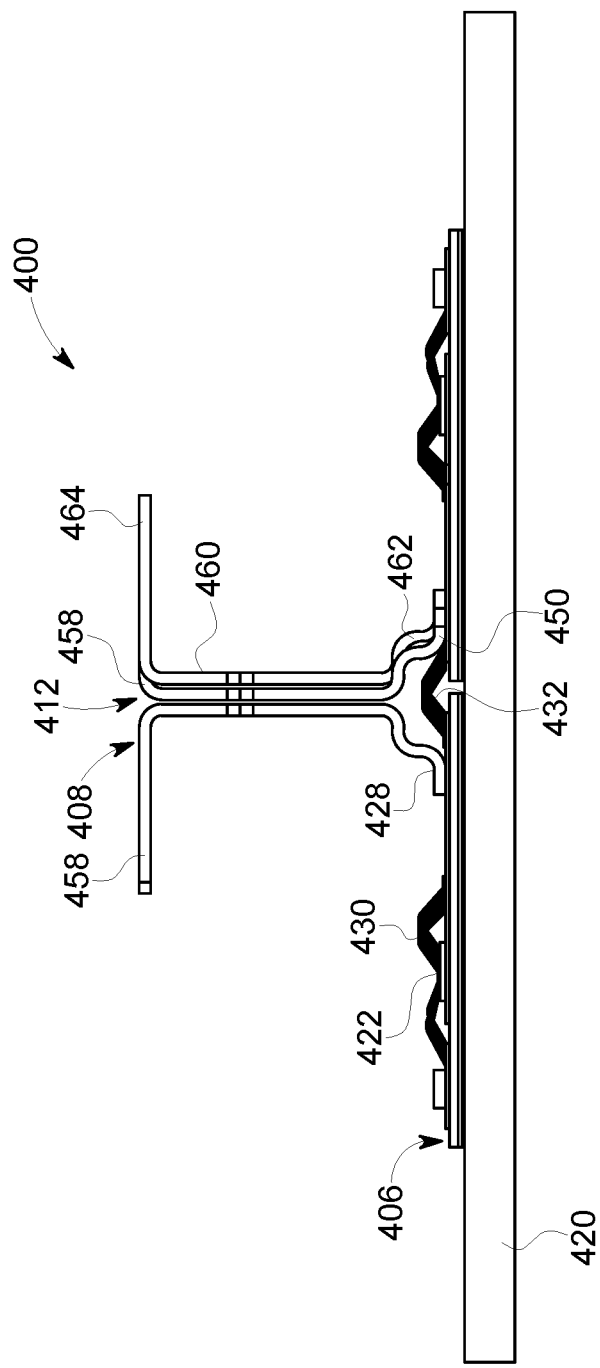
FIG. 6 is a side view of the power module shown in FIGS. 4 and 5.

FIG. 4 is a perspective view of an exemplary power module 400. FIG. 5 is a top view of power module 400. FIG. 6 is a side view of power module 400. In the exemplary embodiment, power module 400 includes a first side 402 and a second side 404. First side 402 includes a first substrate 406 electrically coupled to a first terminal 408. Second side 404 includes a second substrate 410 electrically coupled to a second terminal 412.

First substrate 406 includes a first conductive substrate 414 and a second conductive substrate 416. First and second conductive substrates 414, 416 are patterned copper layers that are disposed on a dielectric layer 418. Dielectric layer 418 may include a ceramic tile. First substrate 406, including first and second conductive substrates 414, 416 coupled to dielectric layer 418 forms a power electronic substrate, such as a direct bonded copper (DBC) substrate. First substrate 406 is disposed on a substantially planar baseplate 420.

First conductive substrate 414 includes a first plurality of power semiconductor switches 422 arranged thereon. For example, in the exemplary embodiment, the first plurality of power semiconductor switches 422 includes metal-oxide semiconductor field-effect transistors (MOSFET). Alternatively, the first plurality of power semiconductor switches 422 may include insulated gate bipolar transistors (IGBT), junction gate field-effect transistors (JFET), bipolar junction transistors (BJT), or a diode. The first plurality of power semiconductor switches 422 may be formed of semiconducting material, such as, for example, silicon, silicon carbide (SiC), Aluminum nitride (AlN), Gallium nitride (GaN), or Boron nitride (BN). In the exemplary embodiment, first conductive substrate 414 includes four power semiconductor switches 422 arranged thereon; however, first conductive substrate 414 may include any number of power semiconductor switches that enables power module 400 to function as described herein.

First conductive substrate 414 includes a T-shaped first conductive substrate having a base portion 424 and a top portion 426. Each of the first plurality of power semiconductor switches 422 is arranged on top portion 426. More specifically, each of the first plurality of power semiconductor switches 422 includes a drain terminal electrically coupled to top portion 426 and is coupled to first terminal 408 via first conductive substrate 414. First terminal 408 is electrically coupled to base portion 424. First terminal 408 is one of soldered or ultrasonically welded to first conductive substrate 414 to form the electrical connection therebetween. First terminal 408 includes a first foot 428 extending therefrom that electrically coupled to first conductive substrate 414.

Each of the first plurality of power semiconductor switches 422 also includes a source terminal electrically coupled to second conductive substrate 416 using a first wire bond 430. That is, each of the first plurality of power semiconductor switches 422 has the source connection on a top side of the switch. First wire bond 430 is coupled to the top side of the switch to couple the source terminal to second conductive substrate 416. Thus, first conductive substrate 414 is electrically coupled to second conductive substrate 416 via the first plurality of power semiconductor switches 422 and first wire bonds 430.

Second conductive substrate 416 is electrically coupled to first wire bonds 430 to form the electrical connection with first conductive substrate 414. Second conductive substrate 416 is also electrically coupled to second wire bond 432 to form an electrical connection with second side 404 of power module 400.

In the exemplary embodiment, second conductive substrate 416 includes an inner second conductive substrate 434 positioned on an inner side of base portion 424, and an outer second conductive substrate 436 positioned on a second side 404 of base portion 424. Inner second conductive substrate 434 and outer second conductive substrate 436 are coupled to the same number of the first plurality of power semiconductor switches 422 to provide symmetrical, dynamic current distribution across the first plurality of power semiconductor switches 422.

Current flowing from first terminal 408 flows into first conductive substrate 414, through the drain terminal of each of the first plurality of power semiconductor switches 422, through the source terminal of each of the first plurality of power semiconductor switches 422, through first wire bonds 430, into inner second conductive substrate 434 and outer second conductive substrate 436, and then to second side 404 via second wire bonds 432.

Second substrate 410 includes a third conductive substrate 438 and a fourth conductive substrate 440. Third and fourth conductive substrates 438, 440 are patterned copper layers that are disposed on a dielectric layer 442. Dielectric layer 442 may include a ceramic tile. Second substrate 410, including third and fourth conductive substrates 438, 440 coupled to dielectric layer 442 forms a power electronic substrate, such as a direct bonded copper (DBC) substrate. Second substrate 410 is disposed on substantially planar baseplate 420.

Third conductive substrate 438 includes a second plurality of power semiconductor switches 444 arranged thereon. For example, in the exemplary embodiment, the second plurality of power semiconductor switches 444 includes metal-oxide semiconductor field-effect transistors (MOSFET). Alternatively, the second plurality of power semiconductor switches 444 may include insulated gate bipolar transistors (IGBT), junction gate field-effect transistors (JFET), bipolar junction transistors (BJT), or a diode. The second plurality of power semiconductor switches 444 may be formed of semiconducting material, such as, for example, silicon, silicon carbide (SiC), Aluminum nitride (AlN), Gallium nitride (GaN), or Boron nitride (BN). In the exemplary embodiment, third conductive substrate 438 includes four power semiconductor switches 444 arranged thereon; however, third conductive substrate 438 may include any number of power semiconductor switches that enables power module 400 to function as described herein.

Third conductive substrate 438 includes a T-shaped third conductive substrate having a base portion 446 and a top portion 448. Each of the second plurality of power semiconductor switches 444 is arranged on top portion 448. More specifically, each of the second plurality of power semiconductor switches 444 includes a drain terminal electrically coupled to top portion 448 and is coupled to second conductive substrate 416 via third conductive substrate 438. The electrical connection of the drain terminal to third conductive substrate 438 enables each of the second plurality of power semiconductor switches 444 to receive current flowing from second conductive substrate 416 to third conductive substrate 438 via second wire bond 432.

Each of the second plurality of power semiconductor switches 444 also includes a source terminal electrically coupled to fourth conductive substrate 440 using a third wire bond 448. That is, each of the second plurality of power semiconductor switches 444 has the source connection on a top side of the switch. Third wire bond 448 is coupled to the top side of the switch to couple the source terminal to fourth conductive substrate 440. Thus, fourth conductive substrate 440 is electrically coupled to third conductive substrate 438 via the second plurality of power semiconductor switches 444 and third wire bonds 448.

Fourth conductive substrate 440 is electrically coupled to third conductive substrate 438 as well as to second terminal 412. Second terminal 412 is one of soldered and ultrasonically welded to fourth conductive substrate 440 to form the electrical connection therebetween. Second terminal 412 includes a first foot 450 and a second foot 452 extending therefrom that electrically coupled to fourth conductive substrate 440.

In the exemplary embodiment, fourth conductive substrate 440 includes an inner fourth conductive substrate 454 positioned on an inner side of base portion 446, and an outer fourth conductive substrate 456 positioned on an outer side of base portion 446. Inner fourth conductive substrate 454 and outer fourth conductive substrate 456 are coupled to the same number of the second plurality of power semiconductor switches 444 to provide symmetrical, dynamic current distribution across the second plurality of power semiconductor switches 444.

Current flowing from second conductive substrate 416 flows through second wire bonds 432 into third conductive substrate 438, through the drain terminal of each of the second plurality of power semiconductor switches 444, then through the source terminal of each of the second plurality of power semiconductor switches 444, through third wire bonds 448 into inner fourth conductive substrate 454 and outer fourth conductive substrate 456, and into second terminal via first foot 450 and second foot 452.

In the exemplary embodiment, first terminal 408 is a positive DC terminal and second terminal 412 is a negative DC terminal. First terminal 408 and second terminal 412 are configured to be coupled to positive and negative busbars (not shown), respectively. The "positive" and "negative" DC terminals and/or busbars are at different electric potentials relative to one another during operation, but are not restricted to a specific polarity. In the exemplary embodiment, first terminal 408 and second terminal 412 substantially oppose one another, such that the terminals are in relatively close proximity over substantially the entirety of the terminals. For example, first terminal 408 and second terminal 412 are positioned between first side 402 and second side 404 and, more specifically, between first substrate 406 and second substrate 410. Further, first terminal 408 and second terminal 412 are adjacent to one another extending along a width of power module 400. In some embodiments, first terminal 408 and second terminal 412 extend substantially perpendicularly away from baseplate 420, first substrate 406, and second substrate 410. First terminal 408 and second terminal 412 may also include respective flanges 458 that provide an area for bonding thereto.

Power module 400 further includes an output terminal 460 configured to be coupled to and provide power to an electrical load (not shown). In the exemplary embodiment, output terminal 460 is an AC output terminal 460. Output terminal 460 is disposed in relatively close proximity to first terminal 408 and second terminal 412. For example, output terminal 460 is positioned adjacent to first terminal 408 on first side 402 of power module 400 such that first terminal 408 is between output terminal 460 and second terminal 412. Output terminal 460 is electrically coupled to second conductive substrate 416. More specifically, output terminal 460 is one of soldered or ultrasonically welded to third conductive substrate 438 and is electrically coupled to second conductive substrate 416 via second bond wire 432. Additionally, output terminal 460 may be positioned adjacent to a single DC bus (i.e., either first terminal 408 or second terminal 412), or may be positioned between DC buses (i.e., between first terminal 408 and second terminal 412). Such positioning enables tailoring an AC to DC coupling and symmetrical path lengths. Output terminal 460 includes a first foot 462 electrically coupled to third conductive substrate 438. Output terminal 460 includes a flange 464 to which the port of an electrical load may be physically bolted.

In the exemplary embodiment, power module 400 may further include a third substrate 466 and a fourth substrate 468. Third substrate 466 is positioned on first side 402 of power module 400 adjacent to first substrate 406 along a width of power module 400. Fourth substrate 468 is positioned on second side 404 of power module 400 adjacent to second substrate 410 along the width of power module 400. Third substrate 466 includes identical components and functionalities as first substrate 406, and fourth substrate 468 includes identical components and functionalities as second substrate 410, so their descriptions are not described in detail herein.

Power module 400 provides similar advantages as those provided by power module 100 (shown in FIG. 1). Additionally, power module 400 provides improved symmetry of the first and second pluralities of power semiconductor switches 422, 444 such that current flowing through each of the switches travels substantially the same distance and along substantially the same individual current paths. Such symmetry enables equal current distribution among the switches as well as simultaneous control of the timing of the switches.

Figure 7:
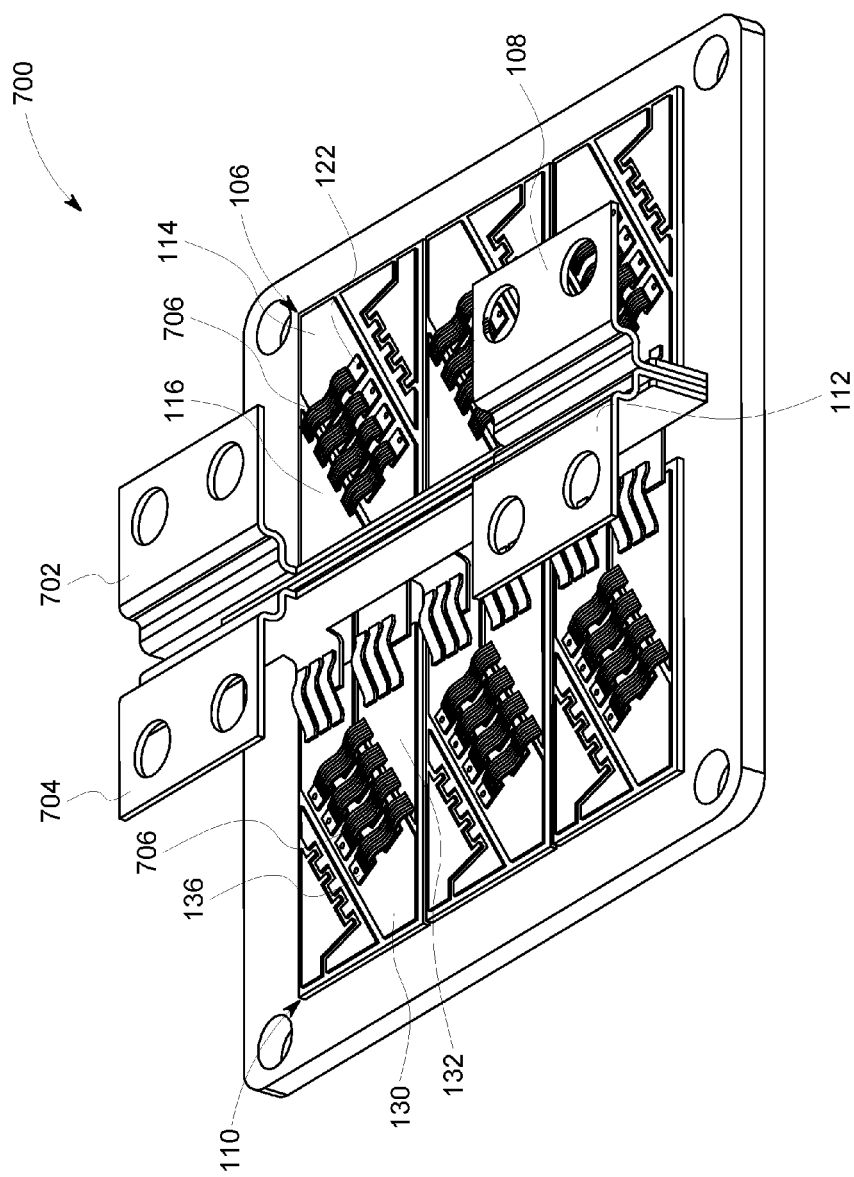
FIG. 7 is a perspective view of an exemplary power module.
Figure 8:
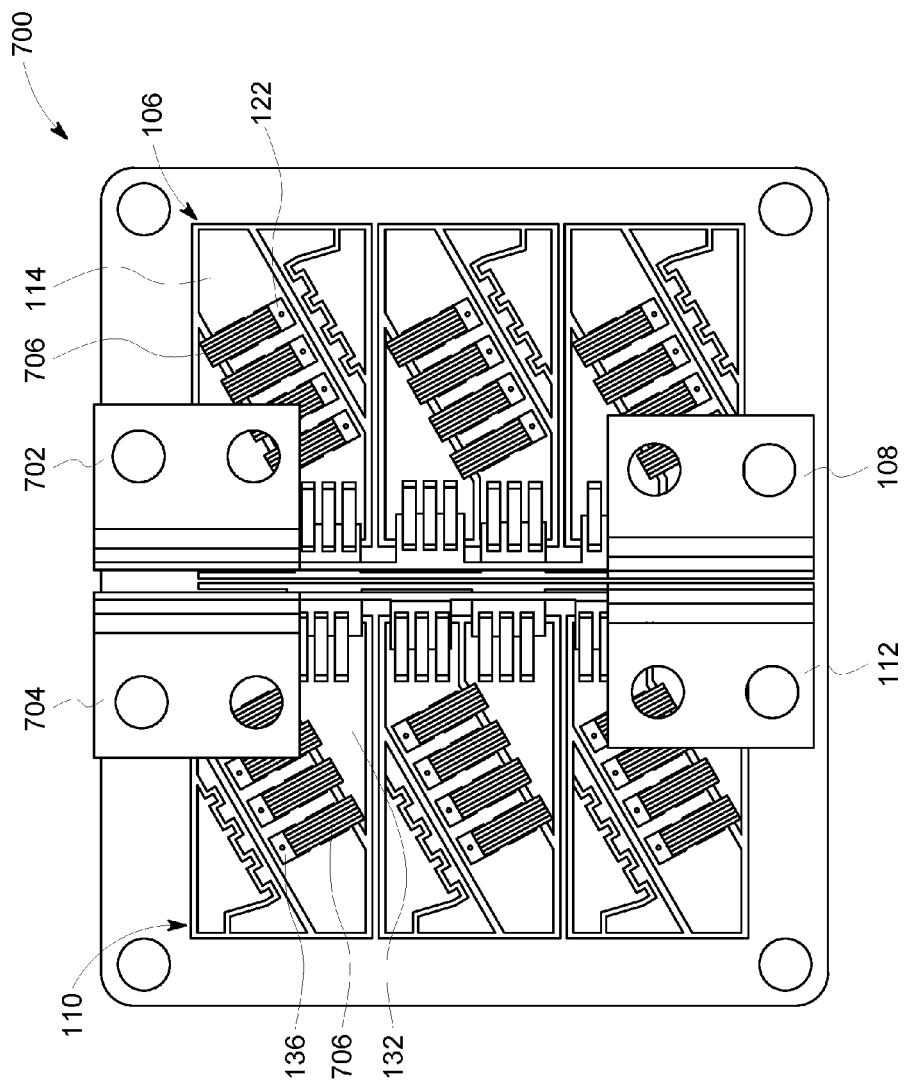
FIG. 8 is a top view of the power module shown in FIG. 7.
Figure 9:
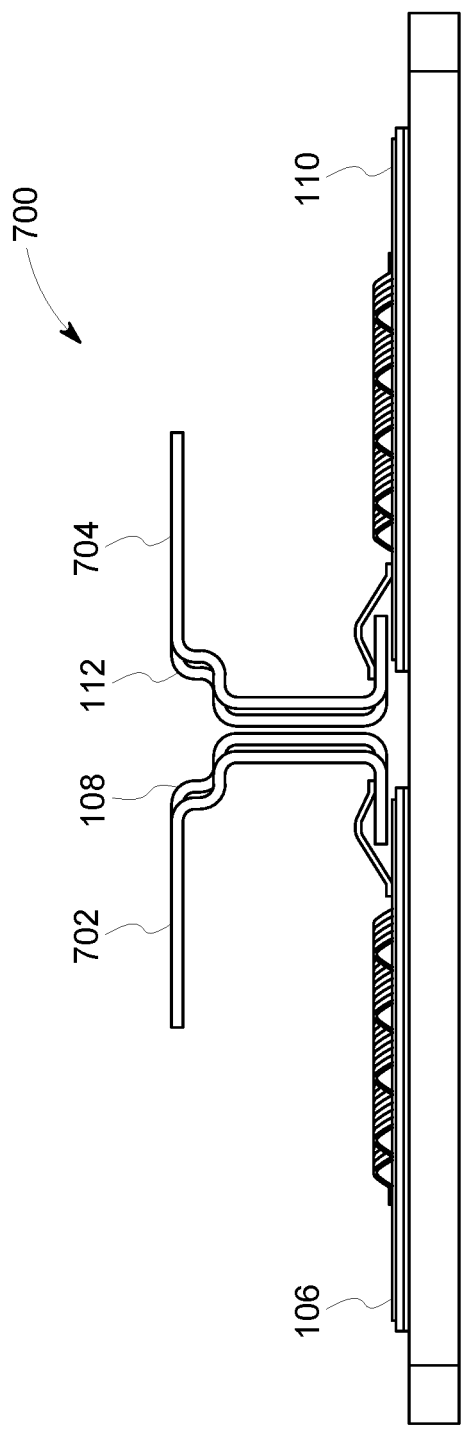
FIG. 9 is a side view of the power module shown in FIGS. 7 and 8.

FIG. 7 is a perspective view of an exemplary power module 700. FIG. 8 is a top view of power module 700. FIG. 9 is a side view of power module 700. Power module 700 is similar to power module 100 (shown in FIGS. 1-3). Accordingly, components of power module 700 that are the same as power module 100 are identified in FIGS. 7-9 using the same reference characters used in FIGS. 1-3, and their description will not be repeated.

In the exemplary embodiment, power module 700 includes first terminal 108 and second terminal 112, and further includes two output terminals, a first output terminal 702 and a second output terminal 704. First and second terminals 108, 112 are positioned adjacent to one another, first output terminal 702 is positioned adjacent to a side of first terminal 108 that is opposite the side adjacent to second terminal 112, and second output terminal 704 is positioned adjacent to a side of second terminal 112 that is opposite the side adjacent to first terminal 108.

In one embodiment, first output terminal 702 and second output terminal 704 are configured or "tied" together either internally within power module 700 or externally outside power module 700. Tying first and second output terminals 702, 704 together forms a similar half-bridge configuration to that described above with respect to FIGS. 1-3. Additionally, the half-bridge configuration facilitates reducing the inductance in the DC+ to DC− loop (i.e., from first terminal 108 to second terminal 112) with close proximity.

In another embodiment, rather than tying them together, first output terminal 702 and second output terminal 704 are separated to enable power module 700 to accommodate two independent low-inductance switches. For example, a first low-inductance switch is formed by tightly coupling first terminal 108 and first output terminal 702, and a second low-inductance switch is formed by tightly coupling second terminal 112 and second output terminal 704. The tight coupling of the AC to DC for both the first and second low-inductance switches facilitates reducing inductance for more complicated electrical topologies where this inductance is also critical.

In an alternative embodiment, similarly to FIGS. 1-3, power module 700 may include only a single output terminal 146. In such an embodiment, the substrates would be either wire bonded or ribbon bonded together.

In the exemplary embodiment, first terminal 108, second terminal 112, first output terminal 702, and second output terminal 704 are either wire bonded or ribbon bonded together their respective conductive substrates. The wire bonding or ribbon bonding facilitates providing increased flexibility in the design and additional options for manufacturing and mechanical stress relief.

In the exemplary embodiment, power module 700 includes first plurality of semiconductor switches 122 and second plurality of semiconductor switches 136. Power module 700 also includes a diode 706 coupled in series with each first semiconductor switch 122 and each second semiconductor switch 136. Specifically, diode 706 is coupled in series between each first semiconductor switch 122 and first output terminal 702. Further, diode 706 is coupled in series between second output terminal 704 and second terminal 112. In the exemplary embodiment, first and second semiconductor switches 122, 136 are MOSFETs and diodes 706 are freewheeling diodes; however, first and second semiconductor switches 122, 136 and diodes 706 may be any other similar device that enables power module 700 to function as described herein. Coupling diodes 706 in series with first and second semiconductor switches 122, 136 creates a much larger footprint, which leads more to the scalability of this style approach, while still maintaining the independently testable substrates prior to full assembly commitment.

Figure 10:
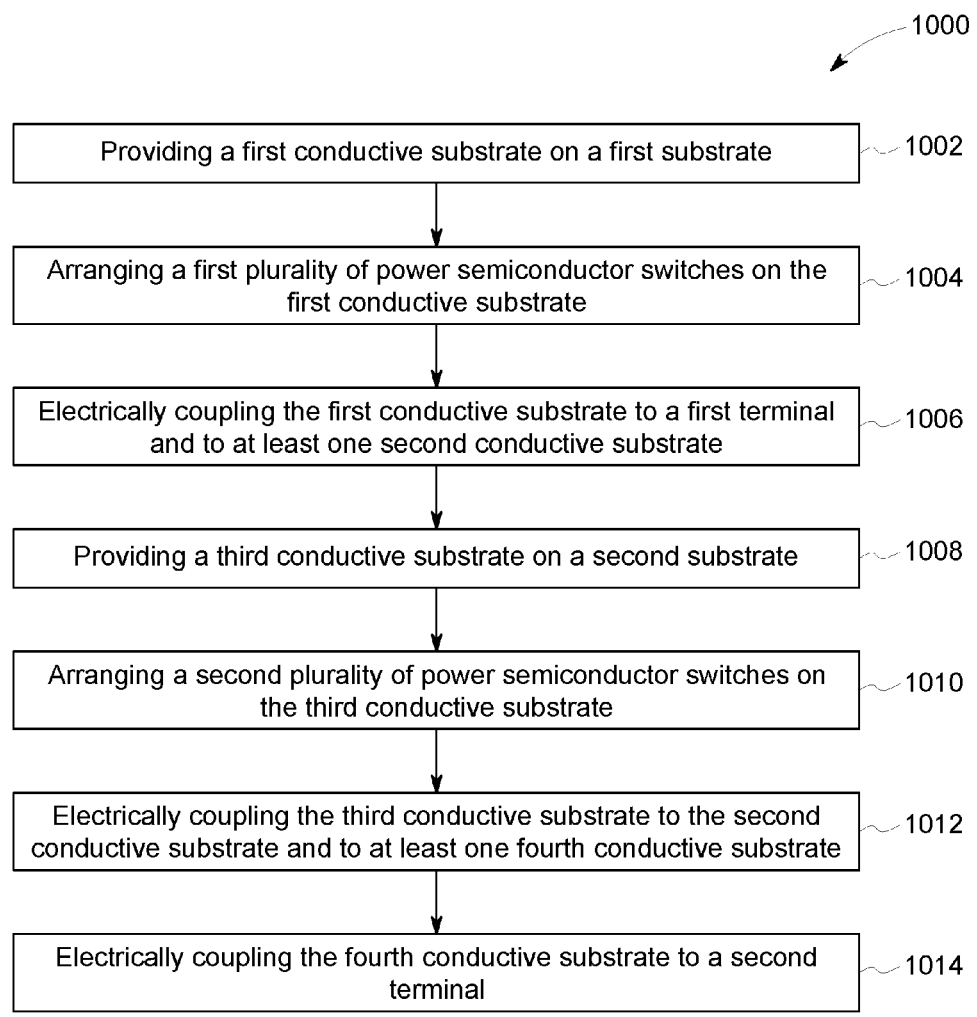
FIG. 10 is a flow chart of an exemplary method of forming the power modules shown in FIGS. 1-3, 4-6, and 7-9 in accordance with an exemplary embodiment of the present disclosure.

FIG. 10 is a flow chart of an exemplary method 1000 of forming power module devices 100, 400, and 700 (shown in FIGS. 1-3, FIGS. 4-6, and FIGS. 7-9, respectively). In the exemplary embodiment, method 1000 includes providing 1002 a first conductive substrate on a first substrate, arranging 1004 a first plurality of power semiconductor switches on the first conductive substrate, and electrically coupling 1006 the first conductive substrate to a first terminal and to at least one second conductive substrate. Method 1000 also includes providing 1008 a third conductive substrate on a second substrate, arranging 1010 a second plurality of power semiconductor switches on the third conductive substrate, and electrically coupling 1012 the third conductive substrate to the second conductive substrate and to at least one fourth conductive substrate. Method 1000 further includes electrically coupling 1014 the fourth conductive substrate to a second terminal.

Figure 11:
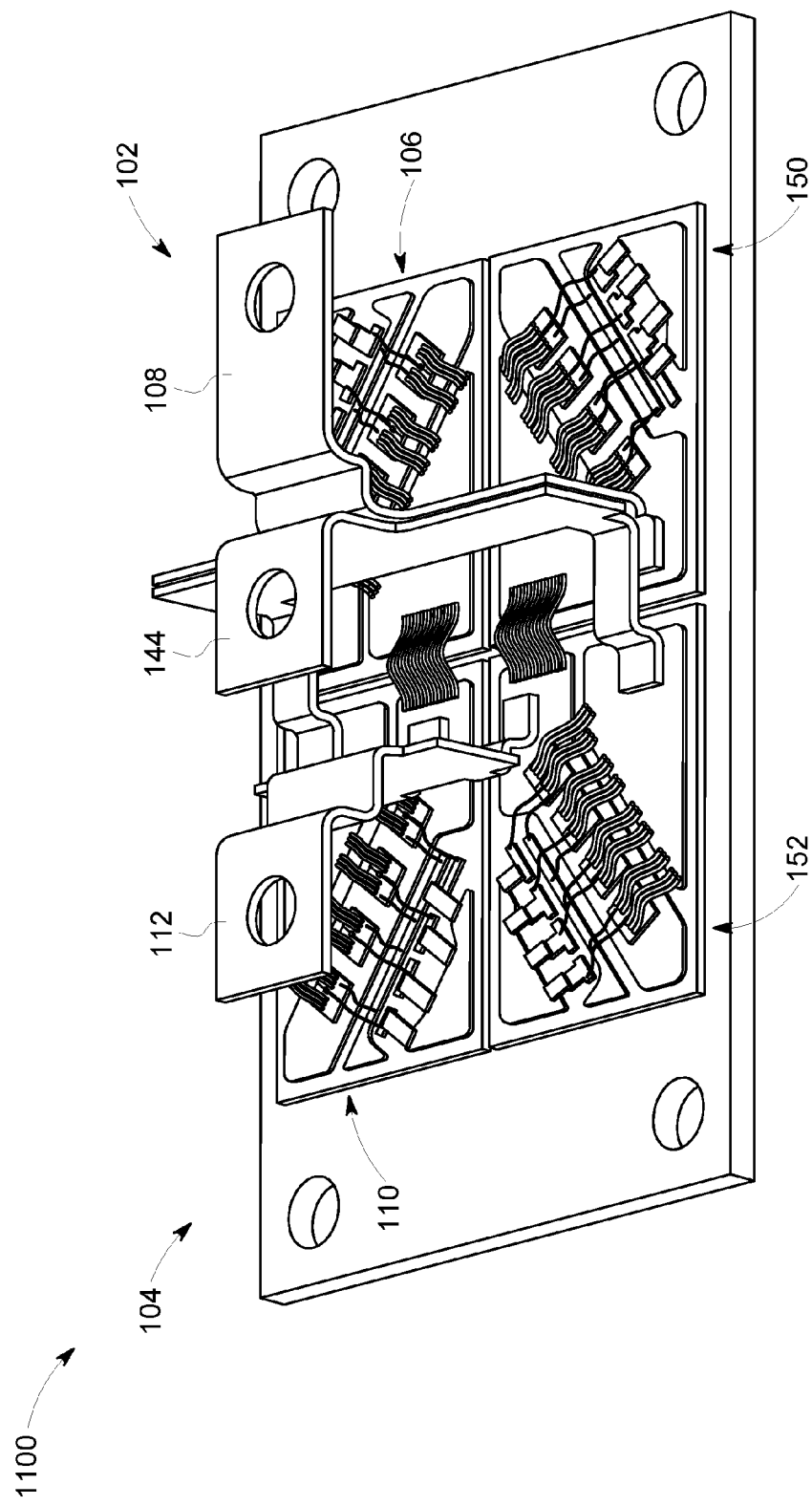
FIG. 11 is a perspective view of an exemplary power module.
Figure 12:
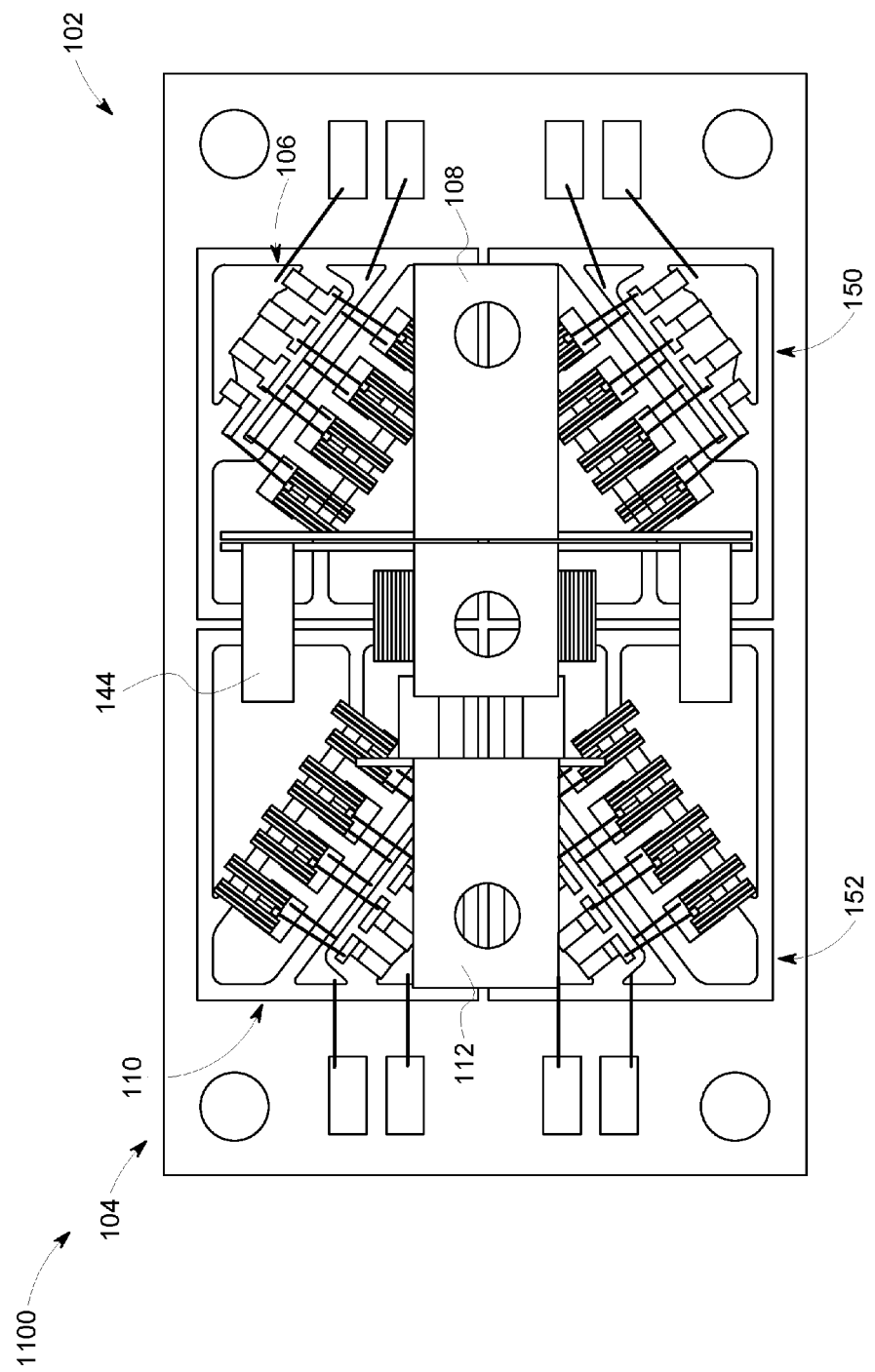
FIG. 12 is a top view of the power module shown in FIG. 11.
Figure 13:
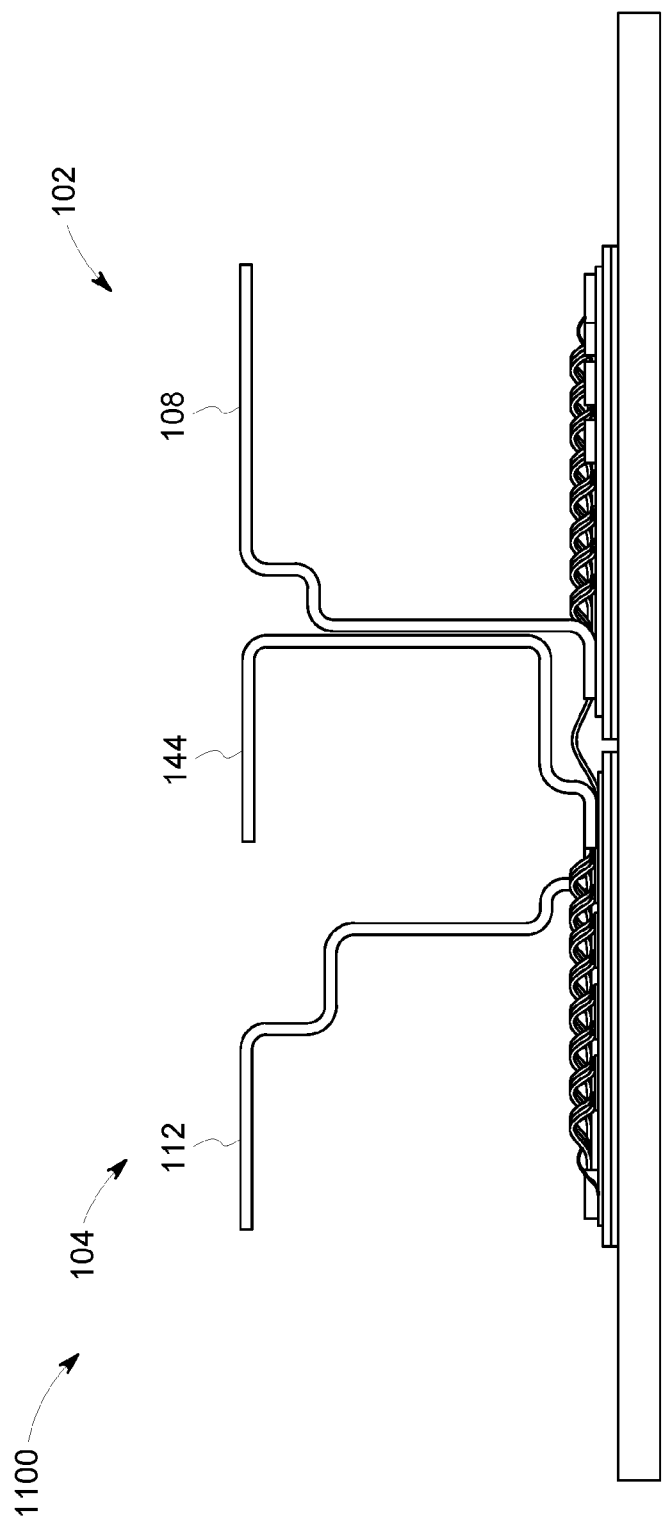
FIG. 13 is a side view of the power module shown in FIGS. 11 and 12.

FIG. 11 is a perspective view of an exemplary power module 1100. FIG. 12 is a top view of power module 1100. FIG. 13 is a side view of power module 1100. Power module 1100 is similar to power module 100 (shown in FIGS. 1-3). Accordingly, components of power module 1100 that are the same as power module 100 are identified in FIGS. 11-13 using the same reference characters used in FIGS. 1-3, and their description will not be repeated. The only difference between power module 1100 of FIGS. 11-13 and power module 100 of FIGS. 1-3 is the configuration of first terminal 108, second terminal 144, and output terminal 112.

In the exemplary embodiment, first terminal 108 and second terminal 144 are tightly coupled and extend along a width of power module 100. First terminal 108 and second terminal 144 are biased towards first side 102 of power module 1100 and, accordingly, extend substantially perpendicularly away from first substrate 106 and third substrate 150.

Output terminal 112 is not positioned adjacent to or tightly coupled with first terminal 108 or second terminal 144. Rather, output terminal 112 extends across only a portion of the width of power module 1100. Additionally, output terminal 112 is biased towards second side 104 of power module 1100 and, accordingly, extends substantially perpendicularly away from second substrate 110 and fourth substrate 152.

The orientation of first terminal 108, second terminal 144, and output terminal 112 is such that they are in-line with power module 1100 and match a standard industry footprint, while also achieving the same low-inductance advantages as power module 100.

A technical advantage of power modules 100, 400 is lower parasitic inductance, which results in a higher operating frequency capability, reduced losses, and higher voltage margin. Any wire bonding is located only on conductive substrates and connection to power terminals is achieved using ultrasonic welding. This enables individual testing of each substrate as well as provides shorter commutation loops, resulting in increased efficiency and lower inductance within power modules 100, 400.

Exemplary embodiments of methods, systems, and apparatus for reducing loop inductance in power switching circuits are not limited to the specific embodiments described herein, but rather, components of systems and/or steps of the methods may be utilized independently and separately from other components and/or steps described herein. For example, the methods may also be used in combination with other systems requiring reduced circuit inductance and the associated methods, and are not limited to practice with only the power inverters, switching modules, and methods as described herein. Rather, the exemplary embodiment can be implemented and utilized in connection with many other applications, equipment, and systems that may benefit from reduced circuit reactance.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power module comprising:
   a first substrate comprising:
      a first conductive substrate having a first plurality of power semiconductor switches arranged thereon; and
      at least one second conductive substrate electrically coupled to said first conductive substrate;
   a first terminal electrically coupled to said first conductive substrate;
   a second substrate comprising:
      a third conductive substrate having a second plurality of power semiconductor switches arranged thereon, said third conductive substrate electrically coupled to said second conductive substrate; and
      at least one fourth conductive substrate electrically coupled to said third conductive substrate; and
   a second terminal electrically coupled to said fourth conductive substrate.

2. The power module according to claim 1, wherein said first terminal, said first substrate, said second substrate, and said second terminal form a common circuit loop configured to minimize commutation loop inductance within said power module.

3. The power module according to claim 1, wherein said first terminal is one of soldered, brazed, sintered, ultrasonically welded, ribbon bonded, and planar interconnected to said first conductive substrate.

4. The power module according to claim 1, wherein said second terminal is one of soldered, brazed, sintered, ultrasonically welded, ribbon bonded, and planar interconnected to said fourth conductive substrate.

5. The power module according to claim 1, wherein each of said first plurality of power semiconductor switches comprises a drain terminal electrically coupled to said first terminal via said first conductive substrate.

6. The power module according to claim 1, wherein each of said second plurality of power semiconductor switches comprises a drain terminal electrically coupled to said second conductive substrate via said third conductive substrate.

7. The power module according to claim 1, wherein each of said first plurality of power semiconductor switches comprises a source terminal electrically coupled to said second conductive substrate using a wire bond.

8. The power module according to claim 1, wherein each of said second plurality of power semiconductor switches comprises a source terminal electrically coupled to said fourth conductive substrate using a wire bond.

9. The power module according to claim 1, wherein said first terminal comprises a positive DC terminal and said second terminal comprises a negative DC terminal.

10. The power module according to claim 1, further comprising an output terminal electrically coupled to said second conductive substrate.

11. The power module according to claim 10, wherein said output terminal is one of soldered, brazed, sintered, ultrasonically welded, ribbon bonded, and planar interconnected to said third conductive substrate and is electrically coupled to said second conductive substrate using one of a bond wire and a ribbon bond.

12. The power module according to claim 10, wherein said output terminal is one of soldered, brazed, sintered, ultrasonically welded, ribbon bonded, and planar interconnected to said second conductive substrate.

13. The power module according to claim 10, wherein said output terminal comprises:
   a first output terminal coupled to said second conductive substrate; and
   a second output terminal coupled to said third conductive substrate,
   wherein said first terminal and said second terminal are positioned between said first output terminal and said second output terminal.

14. The power module according to claim 1, wherein said first conductive substrate and said third conductive substrate each comprise a T-shaped conductive substrate having a base portion and a top portion.

15. The power module according to claim 14, wherein:
   said first plurality of power semiconductor switches are arranged on said top portion of said first conductive substrate;
   said first terminal is electrically coupled to said base portion of said first conductive substrate;

said second conductive substrate is electrically coupled to said base portion of said third conductive substrate; and said second plurality of power semiconductor switches are arranged on said top portion of said third conductive substrate.

16. The power module according to claim 15, wherein said second conductive substrate and said fourth conductive substrate each comprise:
- an inner second conductive substrate positioned on a first side of said base portion; and
- an outer second conductive substrate positioned on a second side of said base portion, the second side opposite from the first side.

17. A method of forming a power module, comprising:
providing a first conductive substrate on a first substrate;
arranging a first plurality of power semiconductor switches on the first conductive substrate;
electrically coupling the first conductive substrate to a first terminal and to at least one second conductive substrate;
providing a third conductive substrate on a second substrate;
arranging a second plurality of power semiconductor switches on the third conductive substrate;
electrically coupling the third conductive substrate to the second conductive substrate and to at least one fourth conductive substrate; and
electrically coupling the fourth conductive substrate to a second terminal.

18. The method according to claim 17, wherein:
electrically coupling the first conductive substrate to the first terminal comprises one of soldering, brazing, sintering, ultrasonically welding, ribbon bonding, and planar interconnecting the first conductive substrate to the first terminal; and
electrically coupling the fourth conductive substrate to the second terminal comprises one of soldering, brazing, sintering, ultrasonically welding, ribbon bonding, and planar interconnecting the fourth conductive substrate to the second terminal.

19. The method according to claim 16, further comprising electrically coupling an output terminal to the second conductive substrate.

20. The method according to claim 16, wherein said first conductive substrate and said third conductive substrate each comprise a T-shaped conductive substrate having a base portion and a top portion.

* * * * *